(12) United States Patent
Yang et al.

(10) Patent No.: US 8,227,861 B2
(45) Date of Patent: Jul. 24, 2012

(54) MULTI-GATE SEMICONDUCTOR DEVICES

(75) Inventors: Hongning Yang, Chandler, AZ (US); Xin Lin, Phoenix, AZ (US); Jiang-Kia Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/975,808

(22) Filed: Dec. 22, 2010

(65) Prior Publication Data

US 2011/0089500 A1    Apr. 21, 2011

Related U.S. Application Data

(62) Division of application No. 11/489,793, filed on Jul. 19, 2006, now Pat. No. 7,910,441.

(51) Int. Cl.
*H01L 21/70* (2006.01)

(52) U.S. Cl. ......... 257/338; 257/335; 257/337; 257/500
(58) Field of Classification Search ............ 438/202, 438/275, 276, 279, 283; 257/335, 337, 500, 257/338
See application file for complete search history.

(56) References Cited

U.S. PATENT DOCUMENTS

| | | |
|---|---|---|
| 2001/0043449 A1 | 11/2001 | Okushima |
| 2004/0256692 A1 | 12/2004 | Kunz et al. |
| 2006/0223258 A1 | 10/2006 | Okushima |
| 2008/0002463 A1 | 1/2008 | Sugizaki |

*Primary Examiner* — Jarrett Stark
*Assistant Examiner* — John M Parker
(74) *Attorney, Agent, or Firm* — Sherry W. Schumm

(57) ABSTRACT

A semiconductor device includes a substrate, a source region formed over the substrate, a drain region formed over the substrate, a first gate electrode over the substrate adjacent to the source region and between the source and drain regions, and a second gate electrode over the substrate adjacent to the drain region and between the source and drain regions.

16 Claims, 4 Drawing Sheets

MULTI-GATE SEMICONDUCTOR DEVICES

RELATED APPLICATION

This application is a Divisional of co-pending U.S. patent application Ser. No. 11/489,793, filed on Jul. 19, 2006.

FIELD OF THE INVENTION

The present invention generally relates to a semiconductor device and a method for forming a semiconductor device, and more particularly relates to a multi-gate semiconductor device.

BACKGROUND OF THE INVENTION

Integrated circuits are formed on semiconductor substrates, or wafers. The wafers are then sawed into microelectronic dies (or "dice"), or semiconductor chips, with each die carrying a respective integrated circuit. Each semiconductor chip is mounted to a package, or carrier substrate, which is often mounted to a motherboard and installed in various electronic systems.

In recent years, integrated circuits have become more complicated both in terms of packing density and the variety of device components that are included in a single circuit. As the productivity and performance demands increase, the size of integrated circuits, as well as the semiconductor chips on which they are formed, continues to be reduced. As the individual devices (e.g., transistors) within the integrated circuits become smaller and smaller, integrated circuit designers and manufacturers must constantly overcome various natural phenomena and limitations due to the design of, as well as the processing steps used to form, the integrated circuits.

One such phenomenon is known as "hot carrier injection" (HCI). HCI occurs when electrons, or holes, are accelerated by a strong electric field and gain very high kinetic energies within a semiconductor device. The high kinetic energies cause impact ionization on the semiconductor lattice to generate pairs of electrons and holes moving in random directions with high kinetic energies, which are called "hot carriers." Some of the hot carriers are injected and trapped in a dielectric within the device (e.g., the gate oxide or silicide block), where they form an undesirable space charge, which can cause device degradation and/or instability.

One current approach for minimizing HCI includes forming an "extended drain" (i.e., a lightly-doped drift region between the channel under the gate and the drain outside the gate). However, such structures are not compatible with current submicron processing techniques. More recently, extended drains have been incorporated by forming a silicide block between the gate and the drain with a self-aligned implantation to form the lightly-doped drift region. However, even with low electric fields, the silicide block experiences significant HCI damage, and the charge trapped within the silicide block causes significant transconductance degradation, as well as the linear current degradation. In order to improve the performance of an extended drain device, the doping within the drift region must be extremely low, which increases the parasitic resistance of the device. The problems associated with HCI are exacerbated as devices continue to get smaller while maintaining relatively high operational voltages (e.g., approximately 5 V). Because of the problems caused by HCI, conventional device designs, such as those incorporating the extended drains using silicide blocks, may not perform adequately while incorporating the latest submicron (e.g., 0.13 micron) technology platforms.

Accordingly, it is desirable to provide a semiconductor device with improved HCI immunity. In addition, it is desirable to provide a semiconductor device with increased current carrying capability that can be constructed using the latest complimentary metal oxide semiconductor (CMOS) processing techniques. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-12 are merely illustrative and may not be drawn to scale.

Figure 1:
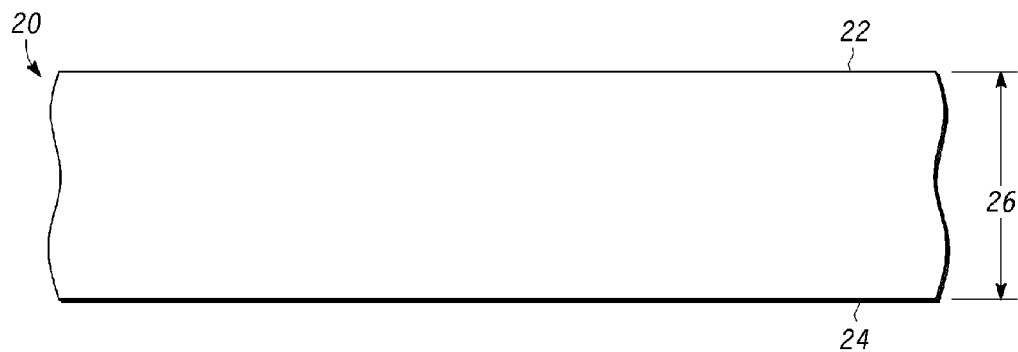
FIG. 1 is a cross-sectional side view of a semiconductor substrate.

Referring to FIG. 1, there is illustrated a semiconductor substrate 20. The semiconductor substrate 20 is made of a semiconductor material, such as gallium arsenide (GaAs), gallium nitride (GaN), or silicon (Si). The substrate 20 has an upper surface 22, a lower surface 24, and a thickness 26 of, for example, between approximately 300 and 1000 microns. The semiconductor material of the substrate 20 may be of a first conductivity type, or doped with a first dopant type, and may include an upper layer of epitaxial silicon, as is commonly understood in the art. In the example illustrated in FIG. 1, the substrate 20 is a "P-type" semiconductor substrate and is doped with boron (B) to a concentration of, for example, approximately $1.0 \times 10^{15}$ atoms per cm$^3$.

Although only a portion of the semiconductor substrate 20 is illustrated, it should be understood that the substrate 20 may be a semiconductor wafer with a diameter of, for example, approximately 150, 200, or 300 millimeters. Additionally, although not specifically illustrated, the substrate 20 may be divided into multiplies dies, or "dice," as commonly understood in the art. Furthermore, although the following process steps may be shown as being performed on only a small portion of the substrate 20, it should be understood that each of the steps may be performed on substantially the entire substrate 20, or multiple dice, simultaneously. Furthermore, although not shown, it should be understood that the processing steps described below may be facilitated by the deposition and exposure of additional photoresist layers, as is commonly understood.

Figure 2:
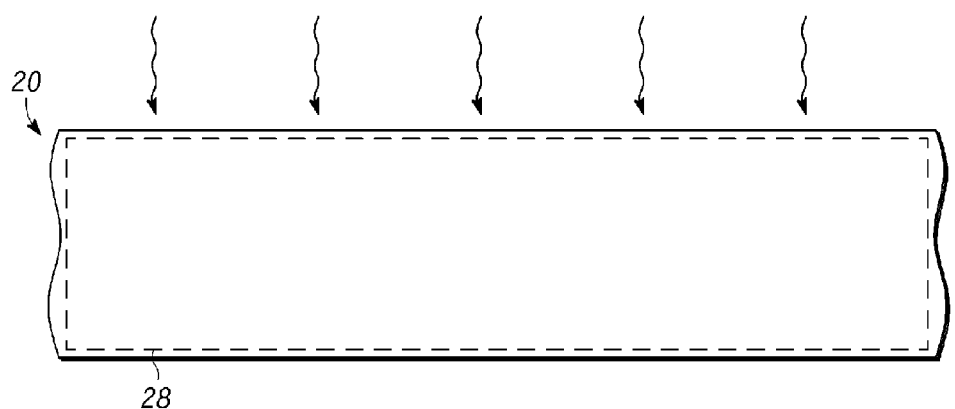
FIG. 2 is a cross-sectional side view of the semiconductor substrate of FIG. 1 undergoing an ion implantation process.

As shown in FIG. 2, a well region 28 is then formed within the substrate 20. In an exemplary embodiment, the well region 28 is formed using ion implantation to have the first conductivity type (e.g., P-type). The well region is, for example, doped with boron to a concentration of between $2.0 \times 10^{16}$ atoms per cm$^3$ and $6.0 \times 10^{17}$ atoms per cm$^3$. Although in the example illustrated in FIG. 2, the well region 28 is shown as covering the entire substrate 20, it should be understood that the well region 28 may only cover discrete portions of the entire substrate 20 and, in one embodiment, has a thickness of approximately 0.5 to 2.0 microns.

Figure 3:
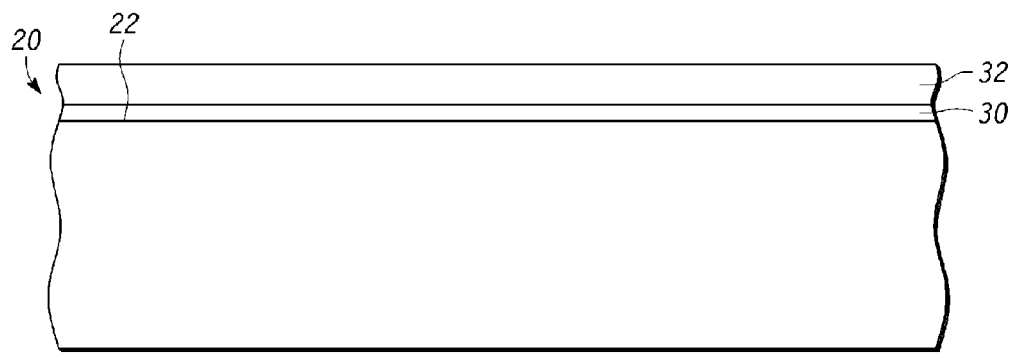
FIG. 3 is a cross-sectional side view of the semiconductor substrate of FIG. 2 with a gate dielectric layer and a gate electrode layer formed thereon.

Referring to FIG. 3, a gate dielectric layer 30 and a gate electrode layer 32 are then formed on the upper surface 22 of the substrate 20. The gate dielectric layer 30 is made of an insulating material, such as silicon oxide, and has a thickness of, for example, between approximately 25 and 400 angstroms. The gate electrode layer 32, in one embodiment, is made of poly-silicon and has a thickness of approximately 0.1 to 0.5 microns. The gate dielectric layer 30 and the gate electrode layer 32 may be formed using, for example, chemical vapor deposition (CVD).

Figure 4:
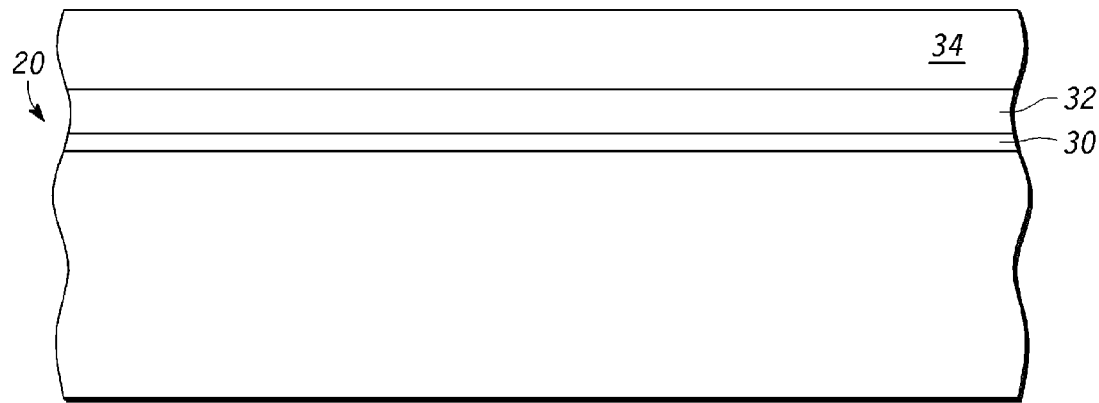
FIG. 4 is a cross-sectional side view of the semiconductor substrate of FIG. 3 with a photoresist layer formed thereon.
Figure 5:
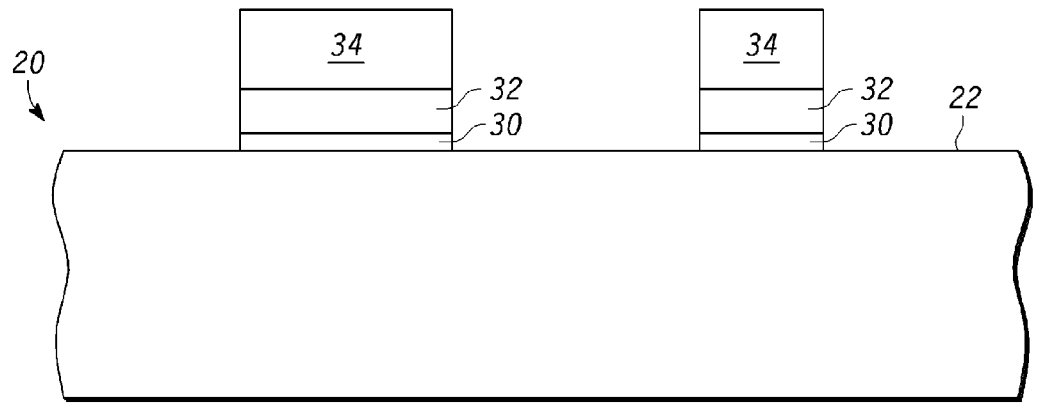
FIG. 5 is a cross-sectional side view of the semiconductor substrate of FIG. 4 after the photoresist layer has been exposed and developed and the gate dielectric layer and the gate electrode layer have been etched to form multiple gate electrodes.
Figure 6:
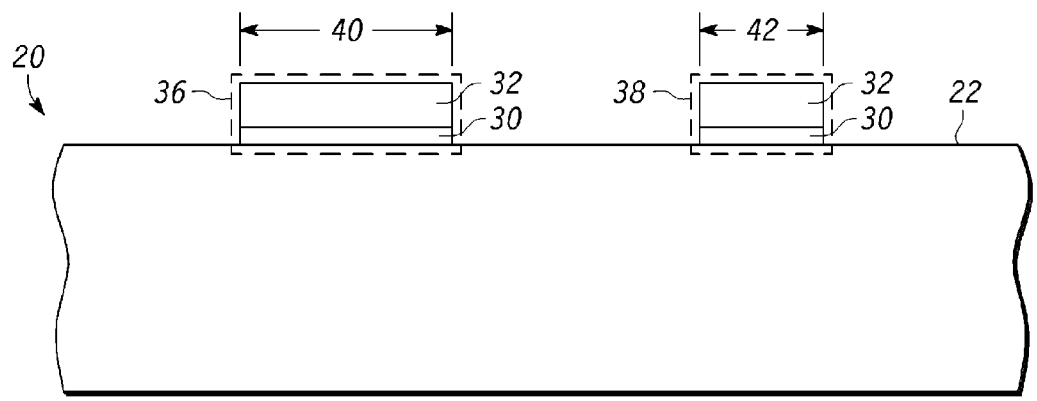
FIG. 6 is a cross-sectional side view of the semiconductor substrate of FIG. 5 after the remainder of the photoresist layer has been removed.

Next, referring to FIGS. 4-6, the gate dielectric layer 30 and the gate electrode layer 32 are patterned and etched. As shown in FIG. 4, a photoresist layer 34 is formed over the gate electrode layer 32 to a thickness of, for example, between 0.5 and 5 microns. The photoresist layer 34 is then selectively exposed and developed to remove portions thereof from over the gate electrode layer 32. The uncovered portions of the gate dielectric layer 30 and the gate electrode layer 32 are then etched to expose specific portions of the upper surface 22 of the substrate 20, as shown in FIG. 5. As illustrated in FIG. 6, the remaining portions of the photoresist layer 34 are then stripped from the gate electrode layer 32. As shown, after the photoresist is stripped, a first gate formation 36 and a second gate formation 38 remain on the upper surface of the substrate 20. Both the first gate formation 36 and the second gate formation 38 include a portion of the gate dielectric layer 30 (i.e., a gate dielectric) and a portion of the gate electrode layer 32 (i.e., a gate electrode).

In one embodiment, the first gate formation 36 has a length 40 that is at least 50% greater than a length 42 of the second gate formation 38. In one embodiment, the length 40 of the first gate formation 36 is between 0.1 and 1.0 microns, and the length 42 of the second gate formation 38 is between 0.05 and 0.6 microns. The length 42 of the second gate formation 38 may correspond to the size of the smallest possible feature (e.g., 0.13 microns) using current complementary metal oxide semiconductor (CMOS) processing steps, as will be appreciated by one skilled in the art. Although not specifically illustrated, the first gate formation 36 and the second gate formation 38 may be connected outside the "active area," as is commonly understood, using either poly lines or contact/metal lines. In addition, the first gate formation 36 is spaced or separated from the second gate formation 38 by a distance, wherein the distance is selected according to the requirements of a given multi-gate semiconductor device implementation.

Figure 7:
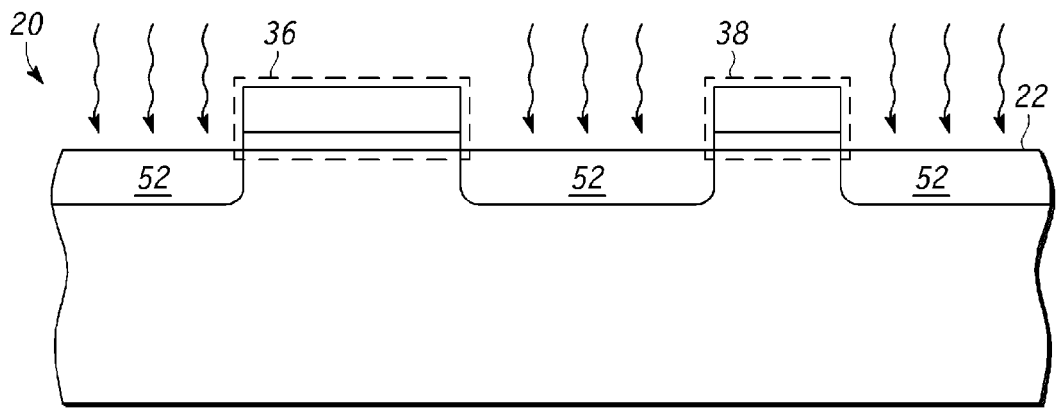
FIG. 7 is a cross-sectional side view of the semiconductor substrate of FIG. 6 undergoing an ion implantation process to form a plurality of lightly-doped drain (LDD) regions.
Figure 8:
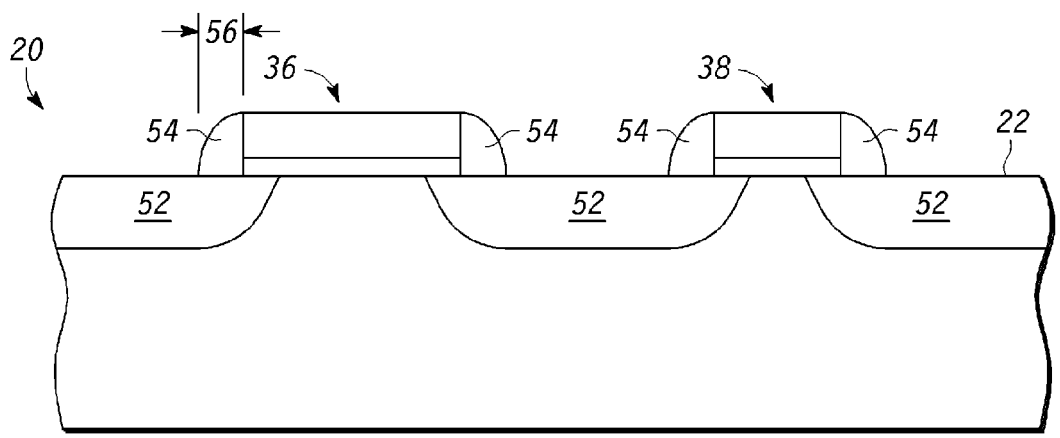
FIG. 8 is a cross-sectional side view of the semiconductor substrate of FIG. 7 with spacers formed on the gate electrodes.

As shown in FIG. 7, a plurality of lightly-doped regions 52 are then formed within the upper surface 22 of the substrate 20. As shown, the lightly-doped regions 52 are formed on opposing sides of each of the first and second gate formations 36 and 38 and completely cover the area therebetween. The lightly-doped regions 52 are formed using, for example, ion implantation and doped to have a second conductivity type (e.g., N-type lightly-doped drain (NLDD) implants) with phosphorous to a concentration of, for example, between $1.0 \times 10^{16}$ atoms per cm$^3$ and $2.0 \times 10^{18}$ atoms per cm$^3$. As shown in FIG. 8, during the implantation process and the thermal cycles afterwards, the lightly-doped regions diffuse laterally beneath the edges of the first and second gate formations 36 and 38.

Still referring to FIG. 8, after the formation of the lightly-doped regions 52, spacers 54 are formed at the edges of the gate formations 36 and 38. The spacers 54 may be made of silicon nitride or silicon oxide and formed using a blanket deposition process followed by an anisotropic etch, as is commonly understood. The spacers 54 have, for example, widths 56 of between 0.03 and 0.15 microns.

Figure 9:
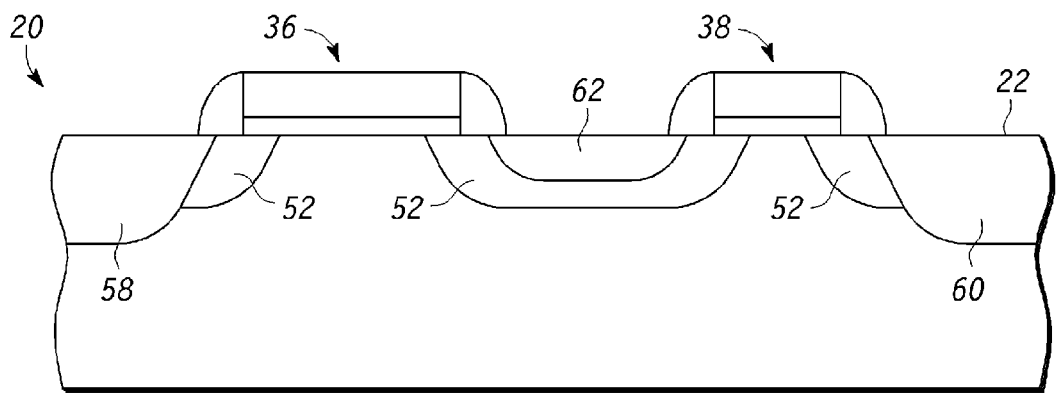
FIG. 9 is a cross-sectional side view of the semiconductor substrate of FIG. 8 with a source region, a drain region, and a separation region formed thereon thus forming a semiconductor device according to one embodiment of the present invention.

Referring now to FIG. 9, a source region 58, a drain region 60, and a separation region 62 are then formed within the upper surface 22 of the substrate 20. The source region 58, the drain region 60, and the separation region 62 may be formed using ion implantation and have N-type conductivity, being doped with phosphorous to a concentration of, for example, between $1.0 \times 10^{19}$ atoms per cm$^3$ and $1.0 \times 10^{21}$ atoms per cm$^3$.

Although not illustrated, it should be understood that when the length 40 of the first gate formation 36 is less than approximately 0.3 microns, a "halo structure" or a "pocket," may be utilized in place of the lightly-doped region 52 that is adjacent to the source region 58, as shown in FIG. 9. As will be appreciated by one skilled in the art, a halo structure or a pocket may include a region that is heavily doped with P-type dopants in an NMOS structure or N-type dopants in a PMOS structure.

As shown, the source region 58 is formed over the lightly-doped region 52 adjacent to the first gate formation 36, the drain region 60 is formed over the lightly-doped region 52 adjacent to the second gate formation 38, and the separation region 62 is formed over the lightly-doped region 52 between the gate formations 36 and 38. As will be appreciated by one skilled in the art, the regions 58, 60, and 62 laterally diffuse beneath the spacers 54. However, the spacers 54 prevent the regions 58, 60, and 62 from diffusing beneath the gate formations 36 and 38. As such, the channels under the gate formations 36 and 38 are each separated from the respective regions 58, 60, and 62 by a portion of one of the lightly-doped regions 52. The regions 58, 60, and 62, in one embodiment, have a thickness of between 0.1 and 2 micron.

The formation of the source, drain, and separation regions 58, 60, and 62, respectively, may substantially complete the formation of a dual gate transistor or device. However, as will be appreciated by one skilled in the art, although not shown, other components, such as well regions and other contact regions, may be included in the formation of the device.

Figure 10:
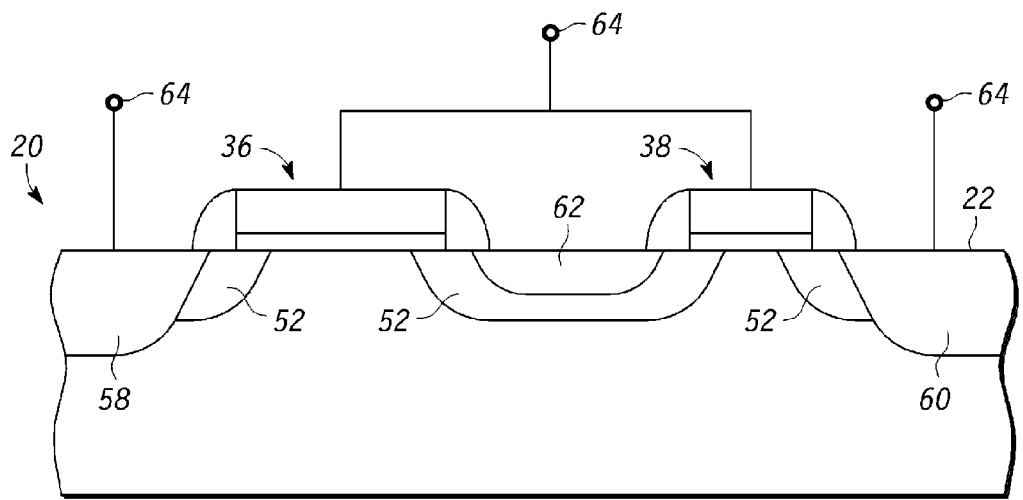
FIG. 10 is a cross-sectional side view of the semiconductor device of FIG. 9 schematically illustrating electrical connections made thereto.

Final processing steps may include the formation of various insulating layers and conductive traces and contacts (e.g., backend processing) over the device to form electrical connections 64 to the first and second gate formations 36 and 38 and the source and drain regions 58 and 60, as illustrated in FIG. 10. As shown, no external electrical connection is made to the separation region 62. As such, the separation region 62 is, in one embodiment, electrically "floating," as is commonly understood. The substrate 20 may then be sawed into individual microelectronic dice, or semiconductor chips, packaged, and installed in various electronic or computing systems.

Still referring to FIG. 10, in an exemplary embodiment, during operation, the source region 58 is grounded and an operational voltage (e.g., approximately 5V) is applied to the drain region 60. The first gate 36 serves as a channel region for the device, and the second gate 38 serves as an extended drain, thus reducing the maximum electric field experienced by the gates 36 and 38. That is, the load of the operational voltage is spread between the first gate 36 and the second gate 38, and as a result, any adverse effects from hot carrier injection (HCI) are greatly reduced.

Figure 11:
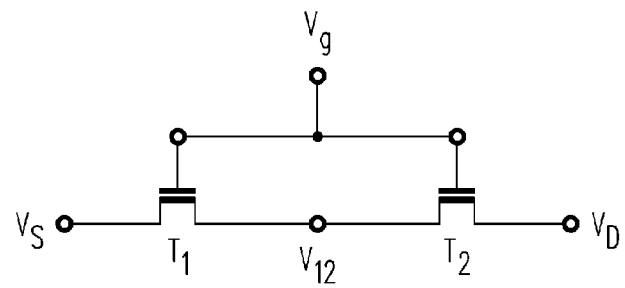
FIGS. 11 and 12 are circuit diagrams of the semiconductor device of FIG. 10.

To illustrate the operation of the dual gate structure more clearly, the structure may be considered to include two NMOS transistors $T_1$ and $T_2$, which are connected in series with a common gate voltage $V_g$, as shown in FIG. 11. The first transistor $T_1$ represents the portion of the structure with the first gate 36 (i.e., the channel region with a higher threshold voltage ($V_t$)). The threshold voltage of the first transistor $T_1$ (i.e., $V_{t1}$) is, for example, between 0.5 and 0.8 V. The second transistor $T_2$ represents the portion of the structure with the second gate 38 (i.e., the channel region with a lower threshold voltage). The threshold voltage of the second transistor $T_2$ (i.e., $V_{t2}$) is, in one embodiment, between −0.1 and 0.1 V.

The threshold voltage for the second transistor $T_2$ may be made negative by creating an extremely short gate length for the second gate 38. During the formation of the lightly-doped regions 52 as shown in FIGS. 7 and 8, the lightly-doped regions 52 can diffuse laterally under both sides of the second gate 38. Since the gate length 42 of the second gate 38 is very small, the lightly-doped regions 52 on both sides of the second gate 38 can be formed such that the regions 52 nearly contact each other and form a so called "depletion mode NMOS," which has a negative threshold voltage and can only be shut off when the gate voltage Vg, as shown in FIG. 11, is negative, as is commonly understood.

Figure 12:
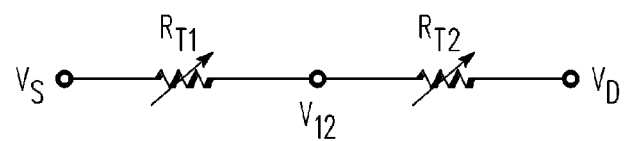

The two-transistor model can be further simplified as two variable resistors $R_{T1}$ and $R_{T2}$ connected in series, as shown in FIG. 12. The value of the first resistor $R_{T1}$ is determined by the gate overdrive from the first gate 36 (i.e., $T_1$), which is the difference between the gate voltage and its threshold voltage (i.e., $Vg-V_{t1}$). Similarly, the value of the second resistor $R_{T2}$ depends on the gate overdrive from the second gate 38 (i.e., $T_2$), which is $V_g-V_{t2}-V_{12}$, where $V_{12}$ is the "floating voltage" on the separation region 62. The higher the gate overdrive, the lower the resistance for the first resistor $R_{T1}$ or the second resistor $R_{T2}$.

For very low drain voltage ($V_D$) biases, (e.g., $V_D$=0.1V), because $V_{12}$ (i.e., the drain bias for $T_1$) is very small ($V_{12}<V_D$=0.1V), it is expected that the gate overdrive from the first gate 36 will be substantially less than the gate overdrive from the second gate 38 (i.e., Vg−Vt1<<Vg−Vt2−$V_{12}$ because Vt1>>Vt2) so that the value of the first resistor $R_{T1}$ is substantially greater than the value of the second resistor $R_{T2}$ (i.e., $R_{T1}>R_{T2}$). In such a case, the first transistor $T_1$ has a greater voltage drop than the second transistor $T_2$. When the drain voltage increases, the floating voltage $V_{12}$ should increase accordingly. When the elevated drain voltage increases to a point such that the overdrives for $T_1$ and $T_2$ become comparable (i.e., $Vg-V_{t1}$~$Vg-V_{t2}-V_{12}$), then the values of the resistors could approximately equalize (i.e., $R_{T1}$~$R_{T2}$), as should the voltage drops in $T_1$ and $T_2$. As the drain voltage is raised further, so is the floating voltage $V_{12}$, and the overdrive voltages begin to reverse (i.e., switch from $V_g-V_{t1}<V_g-V_{t2}-V_{12}$ to $V_g-V_{t1}>V_g-V_{t2}-V_{12}$).

As such, the values of the two resistors $R_{T1}$ and $R_{T2}$ eventually reverse from $R_{T1}>R_{T2}$ to $R_{T1}<R_{T2}$. When this occurs, there is more voltage dropped in the second transistor $T_2$ than in the first transistor $T_1$. Therefore, the second transistor T2, or more specifically the second gate 38, serves as a protective device that limits the actual voltage drop on the first gate 36 (or the first transistor $T_1$) when the supplied drain voltage is higher. The sharing of the drain voltage bias between the first and second transistors $T_1$ and $T_2$ can significantly reduce the electrical field in the gates of 36 and 38, so that the severe HCI damage can be avoided.

Thus, one advantage of the semiconductor device described above is that the HCI immunity is improved, as the likelihood of any damage and/or performance degradation from HCI current is minimized Another advantage is that because the structure of the device is self-aligned, the matching performance of the device is improved. A further advantage is that the saturation current of the transistor is increased, as the saturation current is mainly determined by the length of the first gate which can be very small (e.g., 0.2 micron) without the device being damaged by HCI. Therefore, the overall size of the device is effectively decreased. The on-state resistance of the transistor is also reduced because the first gate length can be reduced and the value of the second resistor $R_{T2}$ is very small when $V_D$ is small (i.e., Vg−Vt1<<Vg−Vt2−$V_{12}$ because Vt1>>Vt2), as the linear drain current is improved compared to a conventional device. A yet further advantage is that the transistor may be constructed using standard complementary metal oxide semiconductor (CMOS) processing steps, thus avoiding increases in manufacturing costs.

Other embodiments may utilize different sizes and/or numbers of gate electrodes than those described above. The device may also be constructed with the first and second gate electrodes having approximately the same width or with the second gate electrode being wider than the first gate electrode. Different dopants and different concentrations of dopants may be used, as is commonly understood. Although the description above refers to P-type as being the first dopant and conductivity type and N-type as being the second dopant and conductivity type, it should be understood that the dopant types of the various regions may be switched, as is commonly understood in the art.

The invention provides a semiconductor device including a substrate, a source region formed within the substrate, a drain region formed within the substrate, a first gate electrode over the substrate adjacent to the source region and between the source and drain regions, and a second gate electrode over the substrate adjacent to the drain region and between the source and drain regions.

The first and second gate electrodes may be separated by a distance. The semiconductor device may also include a separation region over the substrate between the first and second gate electrodes. The first gate electrode may have a first length, and the second gate electrode may have a second length that is substantially different from the first length. The first length may be greater than the second length. The first length may be at least 50 percent greater than the second length.

The substrate may be a semiconductor substrate and have a first dopant type, and the first gate electrode, the second gate electrode, and the separation region may have a second dopant type. Each of the first and second gate electrodes may have a first end and a second end, and the semiconductor device may also include a first gate member interconnecting the respective first ends of the first and second gate electrodes and a second gate member interconnecting the respective second ends of the first and second gate electrodes.

The second length may be less than 0.2 microns. The first dopant type may be P-type, and the second dopant type may be N-type.

The invention also provides a semiconductor device including a semiconductor substrate having a first dopant type, a source region having a second dopant type formed within the semiconductor substrate, a drain region having the second dopant type formed within the semiconductor substrate, a separation region having the second dopant type formed within the semiconductor substrate between the source and drain regions, a first gate electrode formed over the semiconductor substrate adjacent to the source region and the separation region, and a second gate electrode formed over the semiconductor substrate adjacent to the drain region and the separation region.

The first gate electrode may have a first length, and the second gate electrode may have a second length. The first length may be at least 50% greater than the second length. The second length may be less than 0.2 microns. The first dopant type may be P-type, and the second dopant type may be N-type. The first gate electrode may have a first length, and the second gate electrode may have a second length. The first length may be approximately the same as the second length.

The invention further provides a method for constructing a semiconductor device. A source region is formed in a semiconductor substrate having a first dopant type. The source region has a second dopant type. A drain region is formed in the semiconductor substrate. The drain region has the second dopant type. A separation region is formed in the semiconductor substrate between the source and drain regions. The separation region has the second dopant type. A first gate electrode is formed over the semiconductor substrate at least partially between the source region and the separation region. A second gate electrode is formed over the semiconductor substrate at least partially between the drain region and the separation region.

The first gate electrode may be adjacent to the source region and the separation region, and the second gate electrode may be adjacent to the drain region and the separation region. The formation of the first and second gate electrodes may occur substantially simultaneously and include forming a conductive layer over the semiconductor substrate and selectively etching the conductive layer.

The formation of the first and second gate electrodes may also include forming a gate dielectric layer over the semiconductor substrate and selectively etching the gate dielectric layer. The first gate electrode may have a first length, and the second gate electrode may have a second length. The second length may be less than 0.2 microns.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device comprising:
   a substrate having a first dopant type;
   a first gate electrode formed over the substrate;
   a second gate electrode formed over the substrate and spatially separated from the first gate electrode, wherein the first gate electrode has a first length and the second gate electrode has a second length, the second length being substantially different from the first length;
   a first region of a second dopant type formed in the substrate between and partially underlying the first and second gate electrodes, the first region having a first dopant concentration;
   a separation region of the second dopant type formed in the first region, the separation region being spaced apart from the first and second gate electrodes and having a second dopant concentration that is greater than the first dopant concentration;
   a source region formed in the semiconductor substrate on an opposing side of the first gate electrode from the first region, the source region having the second dopant type; and
   a drain region formed in the semiconductor substrate on an opposing side of the second gate electrode from the first region, the drain region having the second dopant type.

2. The semiconductor device of claim 1, wherein the device comprises a dual gate MOS transistor, wherein the first gate electrode serves as a channel region and the second gate electrode serves as an extended drain.

3. The semiconductor device of claim 2, wherein the separation region is a highly doped region that electrically connects the channel region and the extended drain.

4. The semiconductor device of claim 2, wherein the extended drain is lightly doped.

5. The semiconductor device of claim 1, wherein the first length is at least 50 percent greater than the second length.

6. A semiconductor device comprising:
   a substrate having a first dopant type;
   a source region formed in the substrate;
   a drain region formed in the substrate;
   a first gate electrode of a first length over the substrate adjacent to the source region and between the source and drain regions;
   a second gate electrode of a second length that is substantially different from the first length over the substrate adjacent to the drain region and between the source and drain regions, wherein the second gate electrode is spatially separated from the first gate electrode;
   a first region of a second dopant type formed in the substrate between the first and second gate electrodes, the first region having a first dopant concentration; and
   a separation region of the second dopant type formed in the first region, the separation region having a second dopant concentration that is greater than the first dopant concentration.

7. The semiconductor device of claim 6, wherein the first length is greater than the second length.

8. The semiconductor device of claim 7, wherein the first length is at least 50 percent greater than the second length.

9. The semiconductor device of claim 6, wherein the first and second lengths are less than 0.2 microns.

10. The semiconductor device of claim 6, wherein the first dopant type is P-type and the second dopant type is N-type.

11. The semiconductor device of claim 6, further comprising a gate dielectric formed between each of the first and second gate electrodes and the substrate.

12. A semiconductor device comprising:
- a semiconductor substrate having a first dopant type;
- a source region having a second dopant type formed in the semiconductor substrate;
- a drain region having the second dopant type formed in the semiconductor substrate;
- a first region of a second dopant type and a first dopant concentration formed in the substrate between the source and drain regions;
- a separation region having the second dopant type and a second dopant concentration that is greater than the first dopant concentration formed in the first region;
- a first gate electrode formed over the semiconductor substrate adjacent to the source region, partially overlying the first region and spaced apart from the separation region; and
- a second gate electrode formed over the semiconductor substrate adjacent to the drain region, partially overlying the first region and spaced apart from the separation region.

13. The semiconductor device of claim 12, wherein the first gate electrode has a first length and the second gate electrode has a second length, the first length being at least 50 percent greater than the second length.

14. The semiconductor device of claim 13, wherein the second length is less than 0.2 microns.

15. The semiconductor device of claim 12, wherein the first dopant type is P-type and the second dopant type is N-type.

16. The semiconductor device of claim 12, wherein the first gate electrode has a first length and the second gate electrode has a second length, the first length being approximately the same as the second length.

* * * * *